United States Patent
Ryu et al.

(10) Patent No.: US 7,081,182 B2
(45) Date of Patent: Jul. 25, 2006

(54) METHOD AND APPARATUS FOR AUTOMATICALLY MEASURING THE CONCENTRATION OF TOC IN A FLUID USED IN A SEMICONDUCTOR MANUFACTURING PROCESS

(75) Inventors: Jae-Jun Ryu, Seoul (KR); Kyung-Dae Kim, Suwon (KR); June-Ing Gill, Suwon (KR); Yong-Woo Heo, Yongin-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 216 days.

(21) Appl. No.: 10/205,621

(22) Filed: Jul. 26, 2002

(65) Prior Publication Data

US 2003/0054576 A1 Mar. 20, 2003

(30) Foreign Application Priority Data

Jul. 27, 2001 (KR) ............................. 2001-45398

(51) Int. Cl.
*C23F 1/00* (2006.01)
*H01L 21/306* (2006.01)

(52) U.S. Cl. ........................ 156/345.15; 156/345.12
(58) Field of Classification Search ........... 156/345.13, 156/345.11
See application file for complete search history.

(56) References Cited

U.S. PATENT DOCUMENTS

| | | | |
|---|---|---|---|
| 4,722,952 A * | 2/1988 | Hatt ........................... 523/216 |
| 5,364,510 A * | 11/1994 | Carpio ........................ 134/2 |
| 5,426,057 A * | 6/1995 | Tamaoki ..................... 436/146 |
| 5,518,608 A * | 5/1996 | Chubachi ................... 210/96.1 |
| 5,522,918 A * | 6/1996 | Shiramizu ..................... 95/87 |
| 5,922,106 A * | 7/1999 | Mowry et al. ................. 95/87 |
| 6,542,828 B1 * | 4/2003 | MacDonald et al. .......... 702/25 |
| 6,596,148 B1 * | 7/2003 | Belongia et al. .............. 205/99 |
| 6,668,624 B1 * | 12/2003 | Tani et al. .................... 73/61.52 |
| 2002/0137650 A1 * | 9/2002 | Okumura ..................... 510/247 |
| 2003/0054576 A1 * | 3/2003 | Ryu et al. .................... 438/14 |

\* cited by examiner

*Primary Examiner*—Parviz Hassanzadeh
*Assistant Examiner*—Sylvia R. MacArthur
(74) *Attorney, Agent, or Firm*—Volentine Francos & Whitt, PLLC

(57) ABSTRACT

The present invention relates to a method and apparatus for automatically measuring the concentration of total organic carbon (TOC) in chemicals and ultra-pure water that are used in a wet etch process. The apparatus includes a sampling line extending from a processing bath, and a pump, for extracting a fluid sample from the processing bath, a buffer for filtering foreign material or air bubbles from the fluid, and an analyzer for analyzing the concentration of TOC in the fluid.

5 Claims, 4 Drawing Sheets

METHOD AND APPARATUS FOR AUTOMATICALLY MEASURING THE CONCENTRATION OF TOC IN A FLUID USED IN A SEMICONDUCTOR MANUFACTURING PROCESS

BACKGROUND OF THE INVENTION

1. Field of the Invention

The present invention relates to semiconductor manufacturing processes that use chemicals to treat a wafer. In particular, the present invention is directed to a method and apparatus for automatically measuring the concentration of total organic carbon (TOC) in ultra-pure water and chemicals that are used in a semiconductor manufacturing process, e.g., a wet etch process.

2. Description of the Related Art

Throughout the entire semiconductor manufacturing process, ultra-pure water is used as a cleaning solution. The content of the ultra-pure water is strictly monitored and controlled because the wafer yield is influenced by the quality of the ultra-pure water. A main indicator of the water quality is total organic carbon (TOC) content, which is a representative characteristic of the quality of the ultra-pure water that is to be controlled.

Complex and various ultra-pure water producing processes, such as a process for removing organic elements contained in city water, and a process for sterilizing microbes, etc. are required to limit the amount of TOC in the ultra-pure water. The accumulation of microbes in ultra-pure water piping increases the concentration of the TOC in the ultra-pure water. High concentrations of TOC degrade the efficacy of the ultra-pure water or act to contaminate the wafers during their processing. Therefore, ultra-pure water is extracted from ultra-pure water pipes on demand and the pipes are regularly cleaned using hydrogen peroxide.

FIG. 1 shows a conventional semiconductor manufacturing system that monitors, in-line, the concentration of TOC in ultra-pure water fed to a process section 16. The process section 16 includes a plurality of baths 18 in which a wafer is treated. First through $n^{th}$ chemicals are supplied to respective ones of the baths 18 from first through Nth chemical supply sources 12 and 14. On the other hand, ultra-pure water used to clean the wafers after being treated with the chemicals is supplied from a pure water source 10 to a respective bath 18 via an ultra-pure water supply line 10a. An analyzer 20 capable of analyzing the ultra-pure water for its TOC content is disposed in the ultra-pure water supply line 10a. Information from the analyzer 20 is used to control the TOC to remain below a specific level.

Unfortunately, the conventional semiconductor manufacturing system suffers from several problems as follows:

(a) varying quality levels of ultra-pure water and chemicals are not monitored and managed substantially;
(b) production accidents resulting from a mis-injection of chemicals cannot be prevented; and
(c) an influence of a varied contamination level on yield or reliability cannot be perceived because states or degrees of contamination of wafers subjected to processes of one hundred or more are not checked.

SUMMARY OF THE INVENTION

An object of the present invention is to obviate the foregoing problems. To achieve this object, the invention provides a method and apparatus for automatically measuring the concentration of total organic carbon (TOC) in chemicals and ultra-pure water present in the baths of a process section. Furthermore, the present invention ensures the reliability of the measurements by eliminating bubbles in samples that are to be analyzed.

According to an aspect of the invention, an apparatus for automatically measuring the concentration of total organic carbon (TOC) in a fluid used in a semiconductor manufacturing process includes a process section comprising a plurality of fluid baths in which a wafer is processed by reacting layers formed on the wafer with chemicals, extracting means for extracting a sample of fluid from one of the processing baths, and an analyzer for analyzing the concentration of TOC in the sample.

The sample is either ultra-pure water or a chemical. The extracting means may simply be a line extending from the bath and a pump operatively associated with the line so as to draw the fluid through the line. The apparatus also has a buffer for eliminating bubbles or foreign material in the sample to be provided to the analyzer. A sensor and multi-directional valve may be installed in the line upstream of the analyzer. The valve is operated by the sensor to divert the sample according to whether the sensor detects the presence of bubbles in the sample.

The apparatus further includes fluid storage container(s) which is/are connected to the analyzer to provide water and/or an alkaline base for diluting and/or neutralizing the sample if necessary. The chemical for neutralizing the sample is preferably $H_3PO_4$.

According to another aspect of the invention, a method of automatically measuring the concentration of total organic carbon (TOC) in a fluid used in a semiconductor manufacturing process includes the steps of extracting a chemical fluid sample from a processing bath, detecting whether air bubbles are present in the extracted sample, eliminating the bubbles from the sample when the sample is determined to contain the bubbles, analyzing the bubble-free sample to determine the TOC content of the fluid, and returning the analyzed sample to the processing bath.

The viscosity and acidity of the fluid chemical sample may be adjusted before the sample is analyzed. As mentioned above, the viscosity and the acidity of the sample are controlled by mixing the sample with a base and ultra-pure water.

BRIEF DESCRIPTION OF THE DRAWINGS

These and other objects, features and advantages of the present invention will be more readily apparent from the following detailed description of preferred embodiments thereof when taken together with the accompanying drawings, of which.

DETAILED DESCRIPTION OF THE PREFERRED EMBODIMENTS

Figure 1:
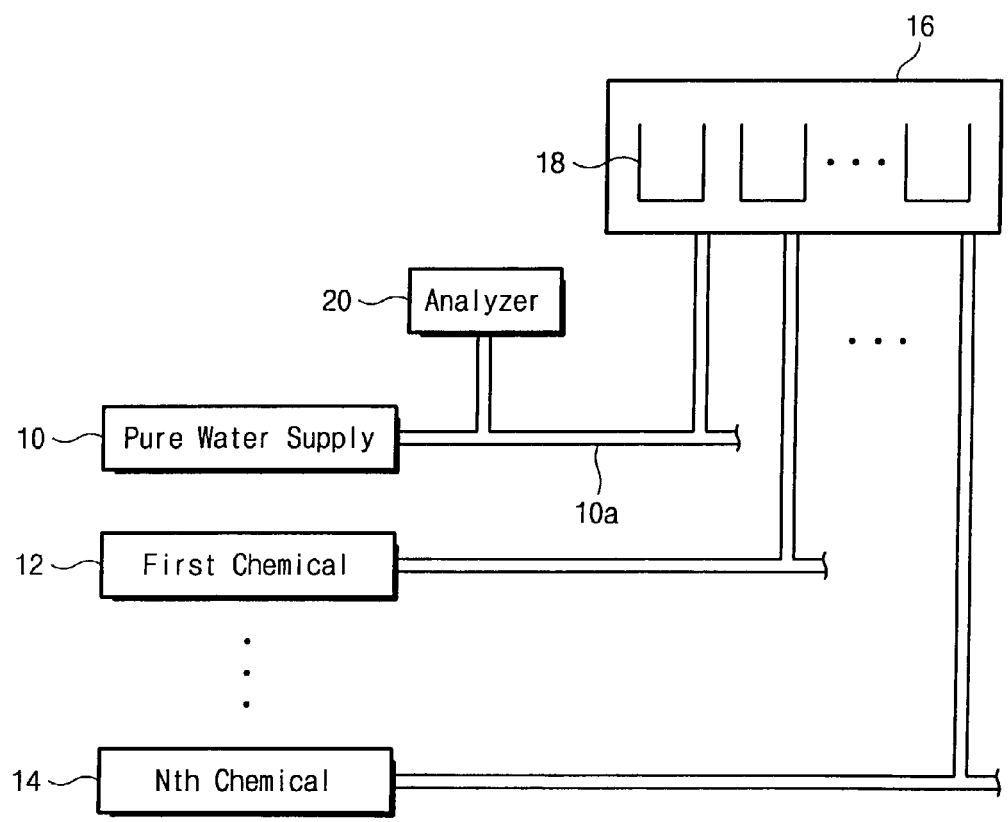
FIG. 1 is a schematic diagram of wet etch equipment including prior art apparatus for automatically measuring a concentration of total organic carbon (TOC)
Figure 2:
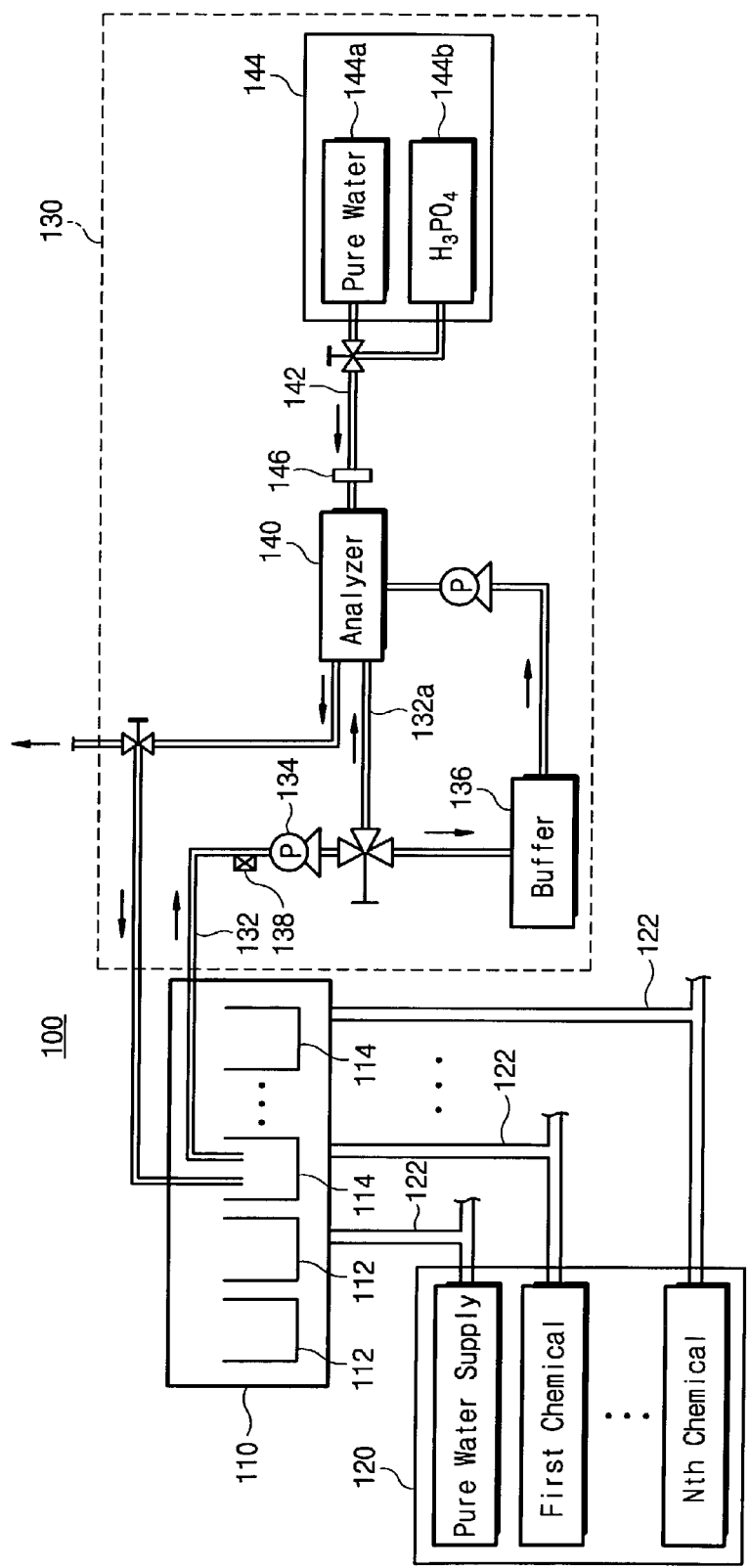
FIG. 2 is a schematic diagram of wet etch equipment including apparatus for automatically measuring a concentration of TOC, according to the present invention.

Referring now to FIG. 2, wet etch equipment 100 includes a process section 110, a chemical fluid supply section 120, supply lines 122, and means 130 for measuring the concentration of total organic carbon (TOC) in a fluid sample.

The process section 110 comprises etch baths 112 and cleaning baths 114 in which wafers are submerged in sequence. The etch baths 112 contain chemicals that facilitate a predetermined (etch) process in which a reaction takes place at layers formed on the wafers. The cleaning baths 114 contain a cleaning solution with which etched wafers are cleaned.

The chemical fluid supply section 120 contain various kinds of fluids (e.g., chemicals and ultra-pure water) that are used in the process section 110. These fluids are supplied from respective chemical fluid supplies of the supply section 120 to the baths 112, 114 of the process section 110 through the supply lines 122.

The TOC concentration measuring means 130 comprises extracting means for extracting chemical fluid samples, an analyzer 140 for analyzing the concentration of TOC contained in the samples, a buffer tank 136 for eliminating air bubbles in the samples before the samples are provided to the analyzer 140, and a fluid storage section 144 comprising containers of pure water and $H_3PO_4$ that are used to control the acidity (pH) and viscosity of the samples such that the analyzer 140 can accurately analyze the samples.

The extracting means comprises a sampling line 132 connected to the process section 110 such that the samples are extracted from the process section 110 itself, i.e., not from the chemical liquid line 122 leading to the process section, and a pump 134 disposed in the sampling line 132.

Figure 3:
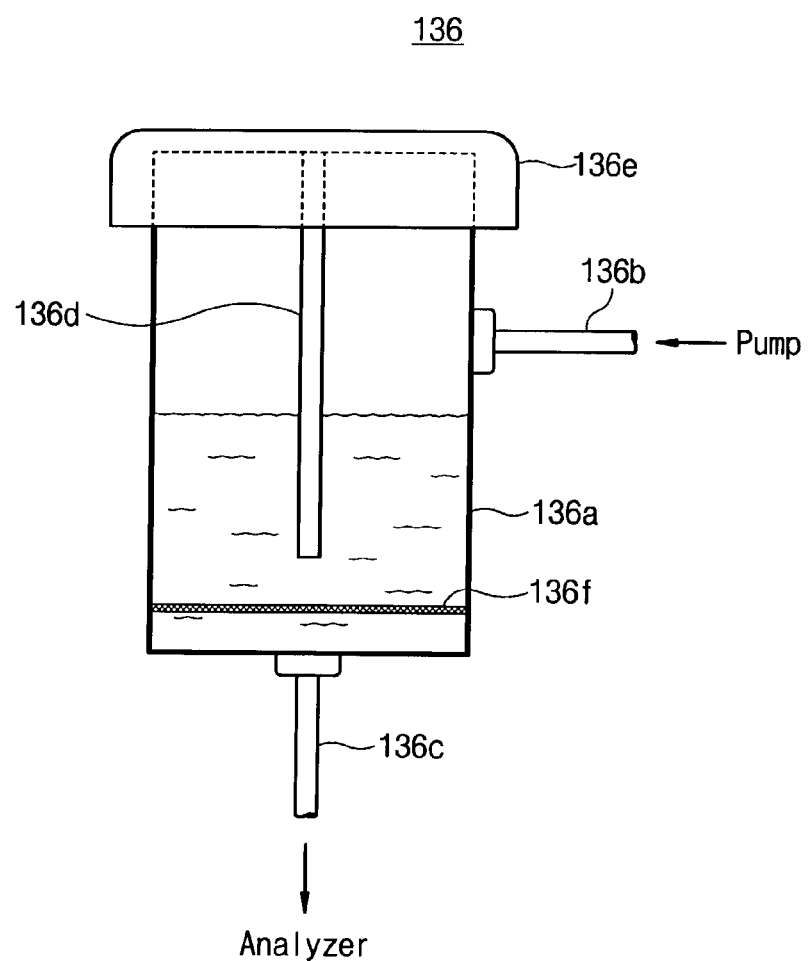
FIG. 3 is a schematic diagram of a buffer tank of the apparatus for automatically measuring a concentration of TOC according to the present invention.

The buffer tank 136 is disposed in the sampling line 132 upstream of the analyzer 140, and eliminates air bubbles in chemical fluid samples flowing into the analyzer 140. More specifically, as shown in FIG. 3, the buffer tank 136 comprises a vessel 136a, an influx port 136b installed on one side of the vessel 136a and defining an opening leading into the vessel for admitting the sample into the vessel, an outflow port 136c installed at the bottom of the vessel 136a, a partition 136d dividing the internal space of the vessel 136a vertically, and a cover 136e covering the top of the vessel 136a. The partition 136d extends vertically downwardly within the vessel 136a and terminates therein at a location spaced from the bottom of the vessel. The outflow port 136c is connected to the analyzer 140 and defines an opening leading out of the vessel at a location directly across from the location at which the partition 136d terminates within the vessel. In addition, the buffer tank 136 may perform an additional function of filtering foreign material from the fluid sample. To this end, a filter 136f, for example, is disposed in the vessel 136a.

Air bubbles in the sample are eliminated by the buffer tank 136 as follows. The air bubbles flow through the sampling line 132 together with the chemical sample, and then the sample flows into the influx port 136b of the buffer tank 136. At this time, the bubbles float upwardly within the vessel 136a and bubble-free fluid is allowed to drain to the outflow port 136c. The drained bubble-free fluid flows into the analyzer 140 through the sampling line 132.

The TOC concentration measuring means 130 also has a direct line 132a that extends from the process section 110 to the analyzer 140, i.e., that bypasses the buffer tank 136. In this way, samples of chemical fluids in which no air bubbles can exist may be directly provided to the analyzer 140 through the sampling line 132 and the direct line 132a. Meanwhile, chemical fluid containing air bubbles is provided to the analyzer 140 after the bubbles have been eliminated therefrom in the buffer tank 136. A sensor 138 is mounted on the sampling line 132 to detect whether air bubbles exist in the chemical fluid flowing therethrough. A 3-way diverter valve, installed at a location where the direct line 132a branches from the sampling line 132, is controlled based on a signal generated by the sensor 138 to establish the direction in which the chemical fluid flows to the analyzer 140. That is, the 3-way diverter valve operates to establish whether the chemical fluid flows to the buffer tank 136 and then on to the analyzer 140 (via sampling line 132) or directly to the analyzer 140 (via the direct line 132a).

The analyzer 140 can analyze chemicals including ultra-pure water. To do so, the analyzer 140 preferably performs a combustion analysis method or a wet oxidation analysis method. Using these methods, chemicals containing HF, $H_2SO_4$, $NH_4OH$, and $H_2O_2$ can be analyzed.

The fluid storage section 144 has a pure water supply (container) 144a and a neutralizing chemical supply (container) 144b and, as mentioned above, allows both the acidity (pH) and viscosity of a fluid chemical sample to be controlled. More specifically, the fluid chemical sample is diluted by pure water supplied from the pure water supply 114a to the analyzer 140 to keep the concentration of the fluid chemical sample at a constant level. If the acidity of the fluid chemical sample is high, a neutralizing chemical is supplied from the neutralizing chemical supply 144b to the analyzer 140 to reduce the acidity of the fluid chemical sample. In this case, $H_3PO_4$ is used as the neutralizing chemical. A chemical fluid supply line 142 is connected between the fluid storage section 144 and the analyzer 140. A flow rate controller 146 for controlling the amount of fluid flowing from the fluid storage section 144 to the analyzer 140 is disposed in the chemical fluid supply line 142.

As is evident form the wet etch equipment described above, the present invention is characterized in that fluid chemical samples are extracted from the processing bath in which a chemical process is being carried out. In addition, the present invention is characterized in the use of a buffer tank for removing air bubbles from the extracted fluid chemical samples, and the use of pure water and chemicals for controlling the concentration and acidity of the fluid chemical samples that are being analyzed.

Figure 4:
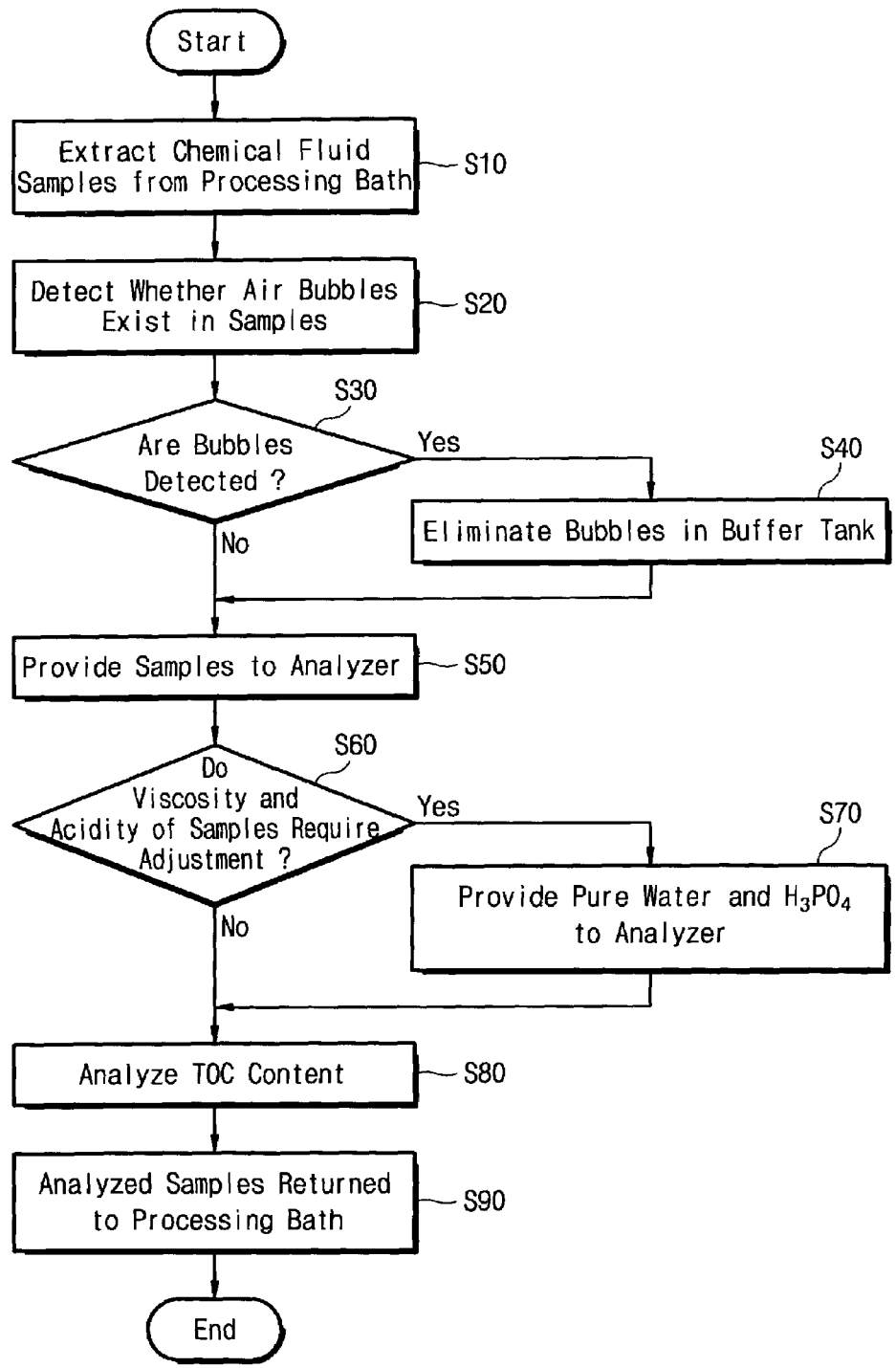
FIG. 4 is a flowchart of a method of measuring the concentration of TOC according to the present invention.

A method of measuring TOC concentration using the foregoing apparatus will be described hereinbelow with reference to FIG. 4.

First, in step S10, chemical fluid samples are extracted from one of the baths of the process section 110. In step S20, the sensor 138 mounted on the sampling line 132 detects whether air bubbles exist in the chemical fluid samples. In step S30, the direction of flow of the chemical fluid samples is established according to the determination made in step S20. If the bubbles are detected, the method proceeds to step S40 in which bubble-containing samples are provided to the buffer tank 136 to eliminate the bubbles, and then flow into the analyzer 140. If the bubbles are not detected, the method proceeds to step S50 in which bubble-free samples flow directly into the analyzer 140. In step S60, the samples flowing into the analyzer 140 are checked to see whether their viscosity and acidity must be controlled. If so, the method proceeds to step S70 in which the viscosity and acidity are controlled by supplying pure water and $H_3PO_4$ to the analyzer 140 from the fluid storage section 144. In step S80, the TOC content of the chemical fluid samples is determined. In the final step S90, analyzed samples may be returned to the processing bath 110.

According to the present invention, varying quality levels in the process can be monitored and managed because chemical fluid samples are extracted from the bath(s) of the process section itself. Furthermore, because the present invention can be applied to chemicals as well as ultra-pure water, on-time contamination prevention monitoring can be accomplished. In addition, air bubbles are eliminated in the samples before they are sent to the analyzer to enhance the reliability of the analysis and minimize potential damage of the analyzer.

Although the present invention has been described by way of example and in terms of the preferred embodiment, it is to be understood that the invention is not to be limited to the disclosed embodiments. Rather, the present invention contemplates various modifications and changes as would be apparent to those skilled in the art. Therefore, all such changes and modifications are seen to be within the true spirit and scope of the invention as defined by the appended claims.

What is claimed is:

1. Apparatus for automatically measuring the concentration of total organic carbon (TOC) in fluid used in a semiconductor manufacturing process, the apparatus comprising:
   a process section comprising a plurality of fluid baths in which a wafer is processed;
   extracting means for extracting fluid from one of said baths, as a sample;
   an analyzer connected to said extracting means for receiving the sample therefrom, said analyzer being operable to analyze the sample for the concentration of TOC in the sample; and
   a buffer that eliminates air bubbles in fluid fed thereto, said buffer being connected to said extracting means so that the buffer can receive a sample from said process section, and said buffer being disposed upstream of and connected to said analyzer, whereby air bubbles are removed from samples received by said buffer before such samples are provided to the analyzer.

2. The apparatus as claimed in claim 1, wherein said buffer includes a filter that filters foreign material from the fluid.

3. The apparatus as claimed in claim 1, and further comprising a sensor and a multi-directional valve operatively associated with said extracting means upstream of said buffer and operable to detect the presence of air bubbles in fluid extracted from said processing section by said extracting means, and direct samples to said buffer when air bubbles are detected in the samples.

4. The apparatus as claimed in claim 3, and further comprising a direct line extending from said multi-directional valve directly to said analyzer, said multi-directional valve being movable between a first position at which the fluid flows through the valve to said buffer, and a second position at which the fluid flows through the valve to said direct line so as to bypass said buffer, said multi-directional valve being moved to said second position responsive to said sensor failing to detect air bubbles in the fluid.

5. The apparatus as claimed in claim 1, wherein said buffer includes a vessel, a partition wall extending vertically downwardly within said vessel and terminating therein at a location spaced from the bottom of the vessel, an influx port connected to said extracting means and defining an opening leading into said vessel for admitting the sample into said vessel, and an outflow port connected to said analyzer and defining an opening leading out from the interior of said vessel at a location on the bottom of the vessel directly across from the location at which said partition wall terminates within the vessel for allowing the sample to drain from the buffer.

* * * * *